United States Patent [19]
Wrzesinski

[11] Patent Number: 4,945,358
[45] Date of Patent: Jul. 31, 1990

[54] SHORT CIRCUIT PROTECTION ARRANGEMENT FOR A DRIVER CIRCUIT
[75] Inventor: Stanley Wrzesinski, Arlington Heights, Ill.
[73] Assignee: Motorola, Inc., Schaumburg, Ill.
[21] Appl. No.: 358,970
[22] Filed: May 30, 1989
[51] Int. Cl.$^5$ ............................................. H02H 3/16
[52] U.S. Cl. ...................................... 361/42; 361/18; 361/58; 361/100
[58] Field of Search .................... 361/58, 59, 18, 75, 361/93, 92, 101, 100, 111, 42

[56] References Cited
U.S. PATENT DOCUMENTS
4,161,760  7/1979  Valentine .................... 361/18

Primary Examiner—Todd E. Deboer

[57] ABSTRACT

A short circuit protection arrangement (2) for a driver circuit (9, 16) including a diode (24) for sensing the presence of a short circuit condition at the driver circuit output; and an arrangement (18, 20, 22, 24) for sensing the discontinuance of the short circuit condition by establishing an inductive current at the output upon the occurrence of the short circuit condition and sensing the increase in voltage at the output due to the inductive current upon discontinuance of the short circuit condition. Such a protection arrangement may be used for each of a plurality of driver circuits (40, 50, 60, 70, 80) utilizing a common inductance (36, 38).

9 Claims, 1 Drawing Sheet

SHORT CIRCUIT PROTECTION ARRANGEMENT FOR A DRIVER CIRCUIT

BACKGROUND OF THE INVENTION

This invention relates to short circuit protection arrangements for driver circuits. Such arrangements are used in automotive applications, for example to protect circuits driving inductive loads such as electric motors and solenoids.

In a typical known short circuit protection arrangement for a driver circuit the driver circuit is automatically disabled when a short circuit condition is sensed. The driver circuit is then periodically re-enabled using a timer circuit to test whether the short circuit condition still exists. If the short circuit condition no longer exists then the driver circuit remains enabled, but if the short circuit condition still exists then the driver circuit is again automatically disabled and later periodically re-enabled.

Such a known protection arrangement produces high current peaks associated with the timer re-tries, which may result in significant electromagnetic interference. Also such a known protection arrangement requires the incorporation of complicated timer circuitry.

SUMMARY OF THE INVENTION

It is an object of the present invention to provide an improved short circuit protection arrangement for a driver circuit wherein the above disadvantages may be overcome or at least alleviated.

In accordance with the present invention there is provided a short circuit protection arrangement for a driver circuit having an input and an output, comprising: means for sensing the presence of a short circuit condition at the driver circuit output and for disabling the driver circuit in response thereto; and means for sensing the discontinuance of the short circuit condition and for re-enabling the driver circuit in response thereto. Thus there is no need to periodically re-try the driver circuit since the discontinuance of the short circuit condition (i.e. the change from the presence of the short circuit to the absence of the short circuit condition) is sensed.

In a preferred embodiment of the invention the means for sensing the discontinuance of the short circuit condition comprises: means for establishing an inductive current at the output upon the occurrence of the short circuit condition; and means for sensing the increase in voltage at the output due to the inductive current upon discontinuance of the short circuit condition.

BRIEF DESCRIPTION OF THE DRAWINGS

One short circuit protection arrangement for a driver circuit in accordance with the present invention will now be described with reference to the accompanying drawings, in which.

DESCRIPTION OF THE PREFERRED EMBODIMENTS

Figure 1:
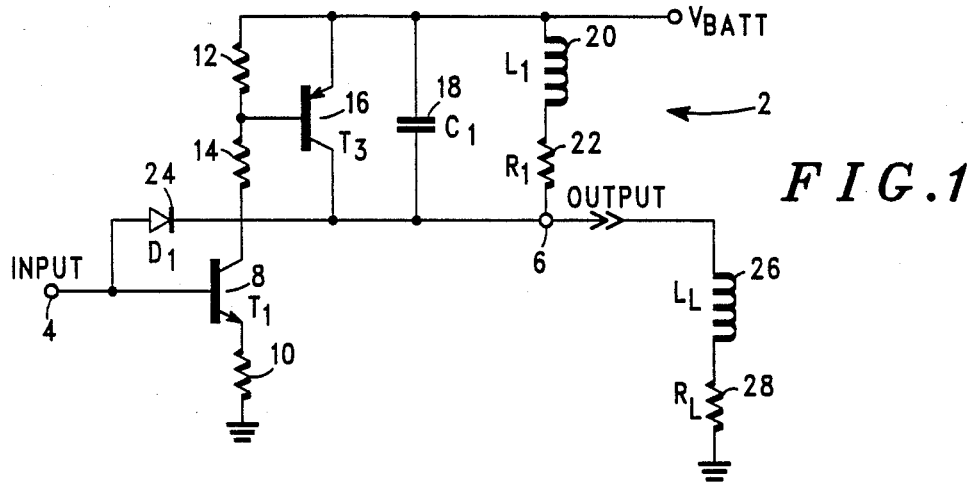
FIG. 1 shows a circuit diagram of a short circuit protected driver circuit driving an electric motor.

Referring now to FIG. 1, a short circuit protected high-side driver circuit 2 for driving an electric motor in automotive applications has an input node 4 and an output node 6. The input node 4 is connected to the base electrode of a npn Darlington transistor 8 whose emitter electrode is connected via a resistor 10 to ground. The collector electrode of the transistor 8 is connected via series resistors 12, 14 to a positive voltage supply $V_{BATT}$ from the positive terminal of an automotive battery (not shown).

A pnp transistor 16 has its base electrode connected via the potential divider formed by the resistors 12, 14 to the positive supply voltage $V_{BATT}$, has its emitter electrode connected to the positive supply voltage $V_{BATT}$ and has its collector electrode connected to the output node 6. A capacitor 18 is connected between the emitter of the transistor 16 and the output node 6. A series connected inductor 20 and resistor 22 are connected in parallel with the capacitor 18 between the emitter of the transistor 16 and the output node 6. A diode 24 is connected between the input node 4 and the output node 6. The output node 6 is connected to drive an electric motor shown conceptually as inductance 26 and resistance 28.

In normal use of the circuit of FIG. 1, a control voltage applied to the input node 4 causes the transistor 8 to conduct. This causes transistor 16 also to conduct, supplying a current to the output node 6 to drive the electric motor 26, 28.

In the event of a short circuit at the output node 6, e.g. due to the output node being connected to ground or due to a short in the windings of the electric motor, the diode 24 becomes forward biased, removing drive from the transistor 8. When transistor 8 ceases to conduct, it causes transistor 16 also to cease conduction. At the same time the short circuit causes the establishment of a "memory" current through the inductance 20 (this "memory" current can be set to any desired level by choice of the value of the resistor 22).

When the short circuit is removed, the arrangement senses the discontinuance of the short circuit and re-enables the drive circuit in the following manner: the inductive "memory" current through the inductance 20 causes a rise in the voltage at the output node 6 due to the increased output impedance. This increased voltage at the output node (which is greater than the control voltage applied to the input node 4) reverse biases the diode 24 and causes transistor 8 to conduct, thus causing transistor 16 also to conduct. When transistor 16 turns on, the voltage at the output increases still further (because of the extra current flowing) and reinforces the unlatching action of the diode 24. The value of the capacitor 18 is chosen so as to shape the voltage pulse occurring at the output node 6 upon discontinuance of the short circuit so as to ensure the desired unlatching action of diode 24.

Thus it will be appreciated that the arrangement of FIG. 1, after sensing the occurrence of a short circuit and disabling the drive circuit, merely establishes the "memory" current through inductor 20 and consumes no significant power (such as would be consumed by periodically re-enabling the transistor 8) until it senses the discontinuance of the short circuit, at which time it automatically re-enables the drive circuit. It will also be realized that the arrangement of FIG. 1 is able to respond very quickly (typically within 10 us of the discontinuance of the short circuit) without having to wait for the next periodic re-enabling of the drive circuit as in the prior art discussed above.

Figure 2:
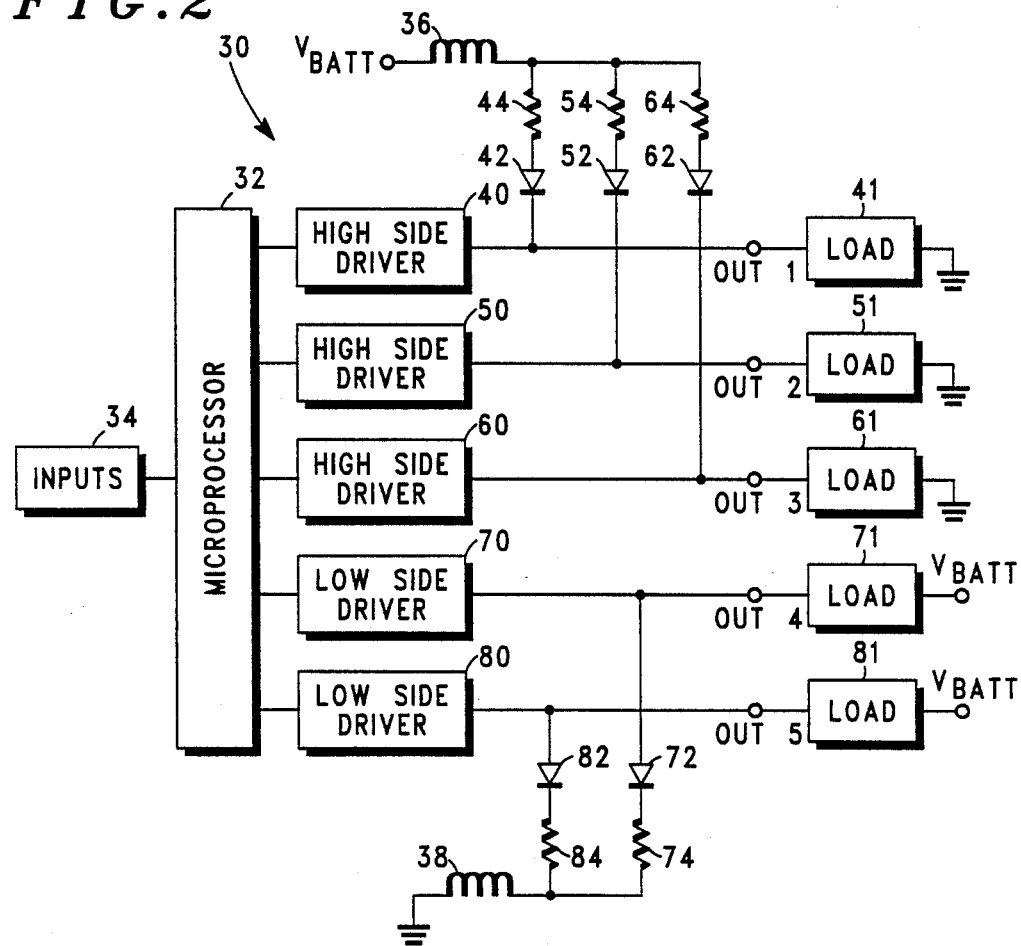
FIG. 2 shows a circuit diagram of an arrangement for short circuit protecting a plurality of driver circuits.

Referring now also to FIG. 2, an arrangement 30 providing short circuit protection to a plurality of drivers in an automotive electronic system includes a microprocessor 32 controlling three high-side drivers 40, 50, 60 and two low-side drivers 70, 80 in dependence on inputs 34. The high-side drivers 40, 50, 60 each comprise essentially the drive circuits formed by transistors 8 and 16, resistors 10, 12 and 14 and diode 24 of FIG. 1. Each high side driver 40, 50, and 60 provides an output to a corresponding inductive load 41, 51, and 61 connected between the output and ground. The low-side drivers 70 and 80 each comprise analogous complementary circuits to those of the high-side drivers and provide an output to a corresponding inductive load 71 and 81 connected between the output and $V_{BATT}$.

The outputs of each of the drivers 40, 50, 60, 70 and 80 are connected to the diodes of respective series-connected diode and resistor pairs 42 and 44, 52 and 54, 62 and 64, 72 and 74 and 82 and 84. The resistors 44, 54, and 64 are connected via a common inductor 36 to the positive battery supply voltage $V_{BATT}$ and the resistors 74 and 84 are connected via a common inductor 38 to ground.

It will be appreciated that in operation of the arrangement of FIG. 2 the drive circuits 40, 50, 60, 70 and 80 operate normally in the same manner as the drive circuit described above with respect to FIG. 1. It will also be appreciated that in the event of a short circuit at the output of one of the drive circuits 40, 50, 60, 70 and 80 these drive circuits operate in the same manner as the drive circuit described above with respect to FIG. 1 (by disabling the drive transistors of the drive circuit having a short circuit load and establishing an inductive "memory" current which serves to generate a voltage pulse at the output and initiates the automatic re-enabling of the driver upon discontinuance of the short circuit). It will be realized, however, that although each of the drivers 40, 50, 60, 70 and 80 has a respective current proportioning resistor 44, 54, 64, 74 and 84 to determine its "memory" current, the high-side drivers 40, 50 and 60 share a common inductor 36 and the low-side drivers 70 and 80 share a common inductor 38, the diodes 42, 52, 62, 72 and 82 serving to steer the commonly generated "memory" currents to the respective drivers. These diodes also provide necessary isolation between the loads to be coupled to the outputs of the drivers 40, 50, 60, 70 and 80.

I claim:

1. A short circuit protection arrangement for a driver circuit having an input, an output, and short circuit protection means for sensing the presence of a short circuit condition at the driver circuit output and disabling the driver circuit in response thereto and for sensing the discontinuance of the short circuit condition and re-enabling the driver circuit in response thereto, the short circuit protection means comprising:
means for establishing an inductive current at the output upon the occurrence of the short circuit condition; and means for sensing the increase in voltage at the output due to the inductive current upon discontinuance of the short circuit condition.

2. An arrangement according to claim 1 wherein the short circuit protection means further comprises a pulse-shaping capacitor for shaping the voltage pulse produced by the increase in voltage at the output.

3. An arrangement according to claim 1 wherein the inductive current establishing means comprises an inductor coupled to the output to carry the inductive current in parallel with current in the driver circuit.

4. An arrangement according to claim 1 wherein the means for sensing the increase in voltage at the output comprises a diode coupled between the output and the input of the driver circuit.

5. An arrangement according to claim 4 wherein the diode also senses the presence of a short circuit condition.

6. A short circuit protection arrangement for a plurality of driver circuits each having an input, an output, and short circuit protection means for sensing the presence of a short circuit condition at a respective one of the outputs of the plurality of driver circuits and disabling the respective driver circuit in response thereto and for sensing the discontinuance of the short circuit condition and re-enabling the respective driver circuit in response thereto, each short circuit protection means comprising:
means for establishing an inductive current at the output of a respective driver circuit upon occurrence of the short circuit condition thereat; and means for sensing an increase in voltage at the respective output due to the inductive current upon discontinuance of the short circuit condition, the inductive current establishing means comprising a common inductor coupled to the respective outputs to carry the inductive current in parallel with current in the plurality of driver circuits.

7. An arrangement according to claim 6 wherein the short circuit protection means further comprise respective isolation diodes connected in series with the common inductor.

8. An arrangement according to claim 7 wherein the short circuit protection means further comprise respective current proportioning resistors connected in series with the respective isolation diodes.

9. A short circuit protection arrangement for a driver circuit having an input, an output and a supply line, comprising:
driver transistor means coupled between the input, the supply line and the output;
diode means coupled between the input and the output for sensing the presence of a short circuit condition at the driver circuit output and for disabling the driver transistor means in response thereto; and
inductor means coupled between the supply line and the output for establishing an inductive current at the output upon occurrence of the short circuit condition,
the diode means sensing an increase in voltage at the output due to the inductive current upon discontinuance of the short circuit condition and re-enabling the driver transistor means.

* * * * *